(12) United States Patent
Sriraman et al.

(10) Patent No.: US 11,856,766 B2
(45) Date of Patent: Dec. 26, 2023

(54) MEMORY CELL HAVING PROGRAMMABLE MATERIAL COMPRISING AT LEAST TWO REGIONS COMPRISING SINX

(71) Applicant: Micron Technology, Inc., Boise, ID (US)

(72) Inventors: Venkatakrishnan Sriraman, Singapore (SG); Dae Hong Eom, Singapore (SG); Ramanathan Gandhi, Boise, ID (US); Donghua Li, Singapore (SG); Ashok Kumar Muthukumaran, Singapore (SG)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 17/391,377

(22) Filed: Aug. 2, 2021

(65) Prior Publication Data

US 2023/0031891 A1   Feb. 2, 2023

(51) Int. Cl.
| | |
|---|---|
| *H10B 43/27* | (2023.01) |
| *H10B 41/27* | (2023.01) |
| *H01L 29/788* | (2006.01) |
| *H01L 29/792* | (2006.01) |
| *H01L 29/66* | (2006.01) |

(52) U.S. Cl.
CPC ....... *H10B 41/27* (2023.02); *H01L 29/66825* (2013.01); *H01L 29/66833* (2013.01); *H01L 29/788* (2013.01); *H01L 29/792* (2013.01); *H10B 43/27* (2023.02)

(58) Field of Classification Search
CPC ....... H01L 27/11524; H01L 27/111529; H01L 27/11563–11582; G11C 16/0483; G11C 16/0466–0475; G11C 27/005; G11C 11/5671; H10B 41/00–70; H10B 43/00–50
See application file for complete search history.

(56) References Cited

U.S. PATENT DOCUMENTS

| | | | |
|---|---|---|---|
| 2019/0051660 A1* | 2/2019 | Carlson | H01L 29/512 |
| 2019/0198320 A1* | 6/2019 | Wells | H01L 21/02595 |
| 2020/0235112 A1* | 7/2020 | Howder | H01L 29/40117 |
| 2021/0343729 A1* | 11/2021 | Surthi | H01L 27/11524 |

\* cited by examiner

*Primary Examiner* — Laura M Menz
*Assistant Examiner* — Candice Chan
(74) *Attorney, Agent, or Firm* — Wells St. John P.S.

(57) ABSTRACT

A memory cell comprises channel material, charge-passage material, programmable material, a charge-blocking region, and a control gate. The programmable material comprises at least two regions comprising $SiN_x$ having a region comprising $SiO_y$ therebetween, where "x" is 0.5 to 3.0 and "y" is 1.0 to 3.0. Methods are disclosed.

30 Claims, 5 Drawing Sheets

MEMORY CELL HAVING PROGRAMMABLE MATERIAL COMPRISING AT LEAST TWO REGIONS COMPRISING SINX

TECHNICAL FIELD

Embodiments disclosed herein pertain to memory cells and to methods used in forming memory cells.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

DETAILED DESCRIPTION OF EXAMPLE EMBODIMENTS

Figure 1:
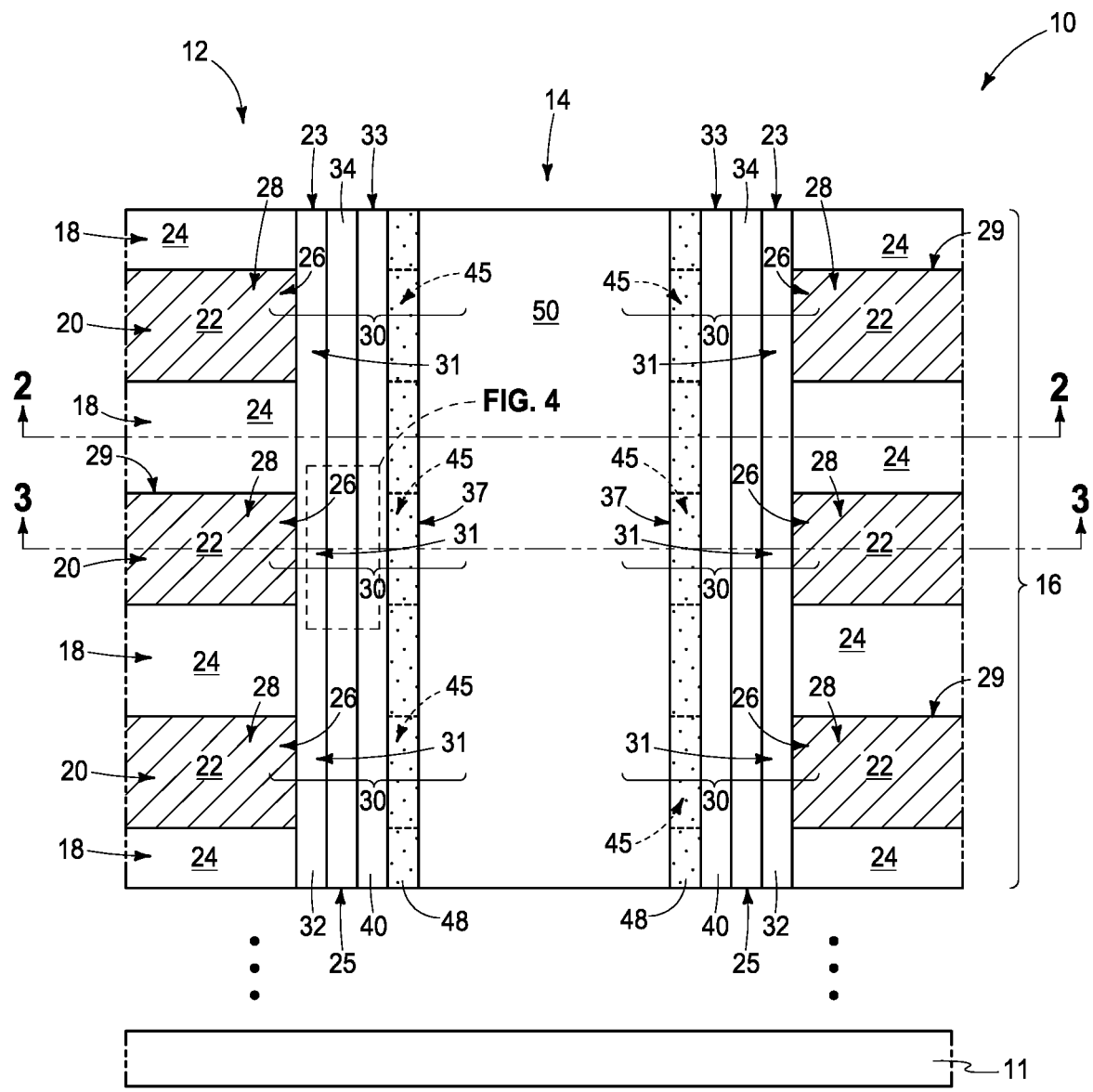
FIG. 1 is a diagrammatic cross-sectional view of multiple memory cells in accordance with an embodiment of the invention.
Figure 2:
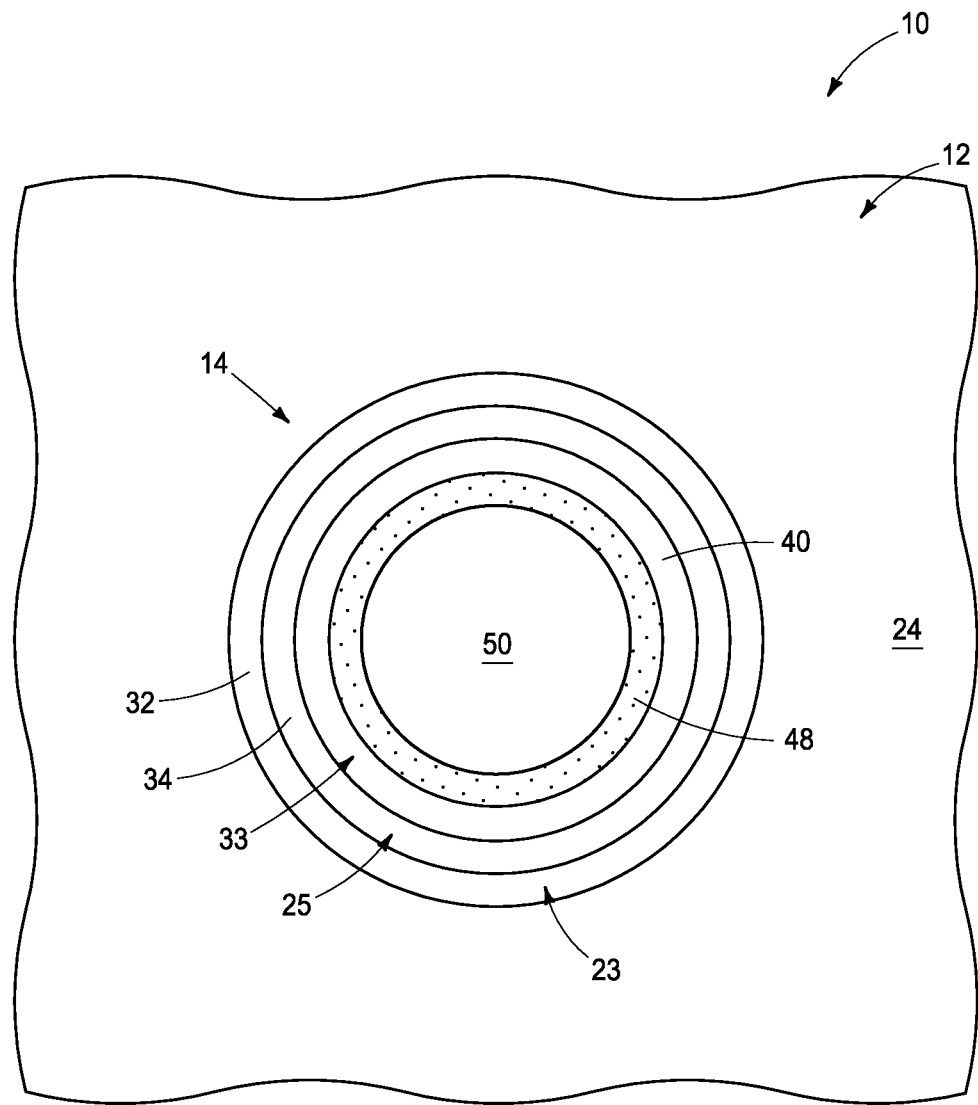
FIGS. 2 and 3 are diagrammatic sections view of FIG. 1.
Figure 3:
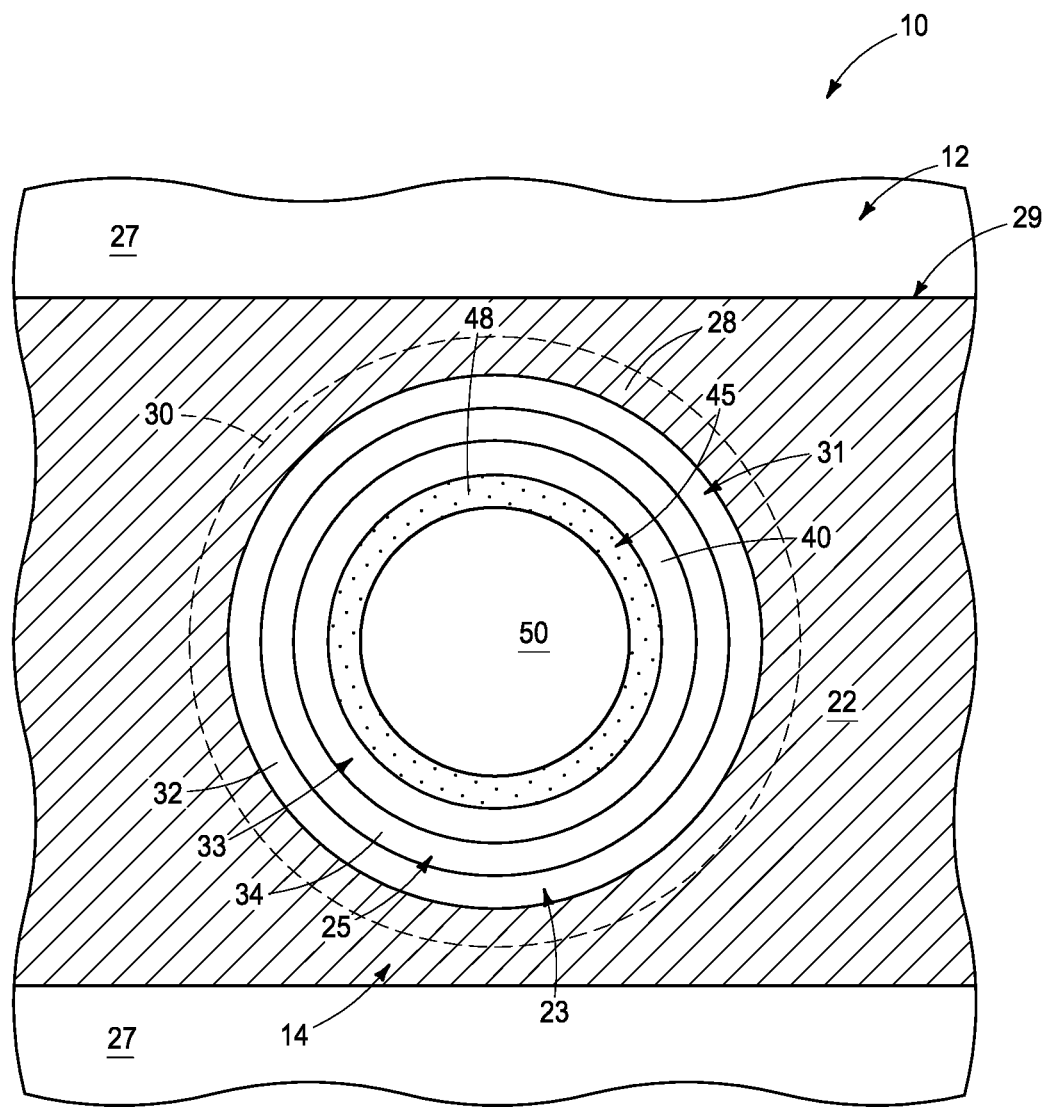
Figure 4:
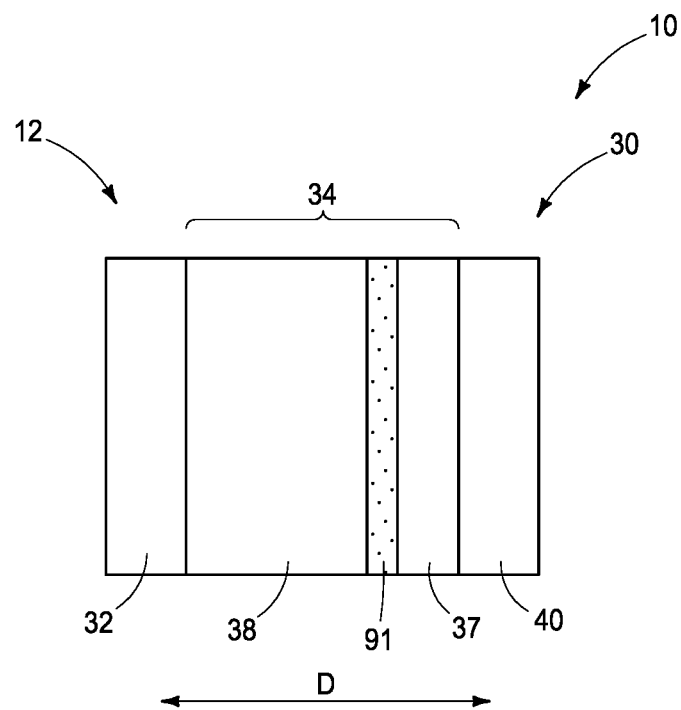
FIG. 4 is an enlargement of a portion of FIG. 1.

Embodiments of the invention encompass a memory cell and a method of forming a memory cell. First example embodiments of an array of elevationally-extending strings of memory cells are described with reference to FIGS. 1-4. A construction 10 comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-4—depicted materials. For example, other partially or wholly fabricated components of integrated circuitry may be provided somewhere above, about, or within base substrate 11. Control and/or other peripheral circuitry for operating components within an array of memory cells may also be fabricated, and may or may not be wholly or partially within a memory cell array or sub-array. Further, multiple sub-arrays may also be fabricated and operated independently, in tandem, or otherwise relative one another. In this document, a "sub-array" may also be considered as an array.

Construction 10 comprises an array 12 of elevationally-extending strings 14 of memory cells 30. Only a single string 14 is shown, with likely hundreds, thousands, tens of thousands, etc. of such strings being included in array 12. Array 12 comprises a vertical stack 16 of alternating insulative tiers 18 and conductive tiers 20 (e.g., wordline tiers). Example tiers 20 comprise conductive material 22. Examples include elemental metals (e.g., tungsten, titanium, copper, etc.), metal material (e.g., metal nitrides, metal silicides, metal carbides, etc.), and conductively-doped-semiconductor materials (e.g., silicon, gallium, etc.), including mixtures thereof. Example tiers 18 comprise insulative material 24 (e.g., doped or undoped silicon dioxide). Array 12 is shown as having seven vertically-alternating tiers 18, 20 in FIG. 1 although fewer or likely many more (e.g., dozens, hundreds, etc.) may be formed. Accordingly, more tiers 18 and 20 may be above and/or below the depicted tiers. Tiers 18 and 20 may be of any suitable vertical thickness(es) and may have the same or different vertical thickness(es) relative one another. As an example, tiers 18 and 20 may have respective thicknesses of about 10 nanometers (nm) to 300 nm.

Conductive material 22 of conductive tiers 20 comprises terminal ends 26 in the depicted FIG. 1 cross-section that correspond to an individual control gate 28 of individual memory cells 30. Approximate locations of memory cells 30 are indicated with brackets in FIG. 1 and with a dashed outline in FIG. 3, with memory cells 30 being essentially ring-like or annular in the depicted example. Control gates 28 may be part of individual control-gate lines 29 (e.g., wordlines; only one being shown and numerically designated in FIG. 3) that interconnect multiple memory cells 30 of multiple strings 14 within individual conductive tiers 20 in a row direction. Dielectric material 27 (FIG. 3; e.g., silicon dioxide and/or silicon nitride) is laterally between control-gate lines 29. Alternate existing or future-developed constructions may be used. For example, multiple memory cells (not shown) may be formed about a single string 14 in an individual wordline tier 20, for example by bifurcating the FIG. 3—depicted control-gate line 29 longitudinally down its middle (not shown) thus creating two memory cells (not shown) that may be separately controlled if such bifurcated control-gate lines are separately controllable.

Individual memory cells 30 have a charge-blocking region 31 that extends elevationally along individual control gates 28 and programmable material 34 (e.g., charge-storage material 34) that extends elevationally along individual charge-blocking regions 31. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate line and the charge-storage material of individual memory cells. An example charge-blocking region as shown comprises insulator material 32 (e.g., silicon dioxide and/or one or more high k materials, having an example thickness of 25 to 80 Angstroms). By way of further examples, a charge-blocking region may comprise a laterally (e.g., radially) outer portion of the charge-storage material (e.g., material 34) where such charge-storage material is insulative (e.g., in the absence of any different-composition material between an insulative-charge-storage material 34 and conductive material 22). Regardless, as an additional example, an interface of a charge-storage material and conductive material of a control gate may be sufficient to function as a charge-blocking region in the absence of any separate-composition-insulator material 32. Further, an interface of conductive material 22 with material 32 (when present) in combination with insulator material 32 may together function as a charge-blocking region, and as alternately or additionally may a laterally-outer region of an insulative-charge-storage material (e.g., a silicon nitride material 34). In one embodiment, charge-blocking region 31 comprises charge-blocking material 32 that is of different composition from those of programmable material 34 and control gate 28

In one embodiment, charge-blocking region 31 is formed from insulator material 32 that extends elevationally along stack 16 and in the form of a tube 23. In one embodiment, programmable material 34 extends elevationally along stack 16 and in the form of a tube 25. An example thickness is 50 to 80 Angstroms. Alternately, and by way of example only, example charge-blocking/insulator material 32, programmable material 34, and charge-passage material 40 may not extend all along vertical stack 16 (not shown).

Individual memory cells 30 comprise a channel region 45 of individual memory cells 30. Example channel region 45 comprises channel material 48. Example channel materials 48 include undoped or appropriately-doped crystalline semiconductor material, such as one or more of silicon, germanium and so-called Group III/V semiconductor materials (e.g., GaAs, InP, GaP and GaN). An example thickness is 50 to 150 Angstroms.

Charge-passage material 40 (e.g., a gate insulator) is laterally (e.g., radially) between channel region 45 and programmable material 34 (and between individual control gates 28 and individual channel regions 45). In one embodiment, charge-passage material 40 extends elevationally along stack 16 and in the form of a tube 33. Charge-passage material 40 may be, by way of example, a bandgap-engineered structure having nitrogen-containing material (e.g., silicon nitride) sandwiched between two insulator oxides (e.g., silicon dioxide). An example thickness is 25 to 80 Angstroms.

Example memory cell string 14 is shown as comprising a radially-central solid dielectric material 50 (e.g., spin-on-dielectric, silicon dioxide, and/or silicon nitride). Alternately, and by way of example only, the radially-central portion of memory cell string 14 may include void space(s) (not shown) or be devoid of solid material (not shown).

Programmable material 34 comprises at least two regions 37, 38 comprising $SiN_x$ having a region 91 comprising $SiO_y$ there between (FIG. 4), where "x" is 0.5 to 3.0 and "y" is 1.0 to 3.0. In one embodiment, "x" is 1.33 (e.g., $Si_3N_4$) and in another embodiment is not 1.33. In one latter such embodiment, "x" is less than 1.33 and alternately is greater than 1.33. In one embodiment, "y" is 2.0 and in another embodiment is not 2.0. In one such latter embodiment, "y" is less than 2.0 and in another such latter embodiment is greater than 2.0. In one embodiment, the at least two regions 37 and 38 comprise a first region 37 and second region 38, with first region 37 being directly against charge-passage material 40 and second region 38 being directly against charge-blocking material 32. In one embodiment, region 91 may be considered as an intervening region 91 that is between and directly against first and second regions 37, 38, respectively. In one embodiment, second region 38 is thicker than first region 37 along a shortest straight-line direction D from charge-passage material 40 to charge-blocking material 32.

In one embodiment, at least two $SiN_x$-comprising regions 37, 38 are at least 1.5 times as thick as $SiO_y$-comprising region 91 there between. In additional such embodiments, at least two $SiN_x$-comprising regions 37, 38 are at least 2.0 times, at least 5.0 times, and/or at least 10.0 times, as thick as $SiO_y$-comprising region 91 there between. As a specific example, a nominal thickness for programmable material 34 is 600 Angstroms, with an example thickness range for region 37 being 15 to 25 Angstroms, for region 38 being 40 to 55 Angstroms, and for region 91 being 2 to 15 Angstroms (all such being along direction D).

In one embodiment, the $SiN_x$ of at least two $SiN_x$-comprising regions 37, 38 are of the same composition relative one another, and in another embodiment are of different compositions relative one another. In one embodiment and as shown, memory cell 30 comprises two and only two of $SiN_x$-comprising regions 37, 38 and one and only one of $SiO_y$-comprising region 91.

Any other attribute(s) or aspect(s) as shown and/or described herein with respect to other embodiments may be used.

Figure 5:
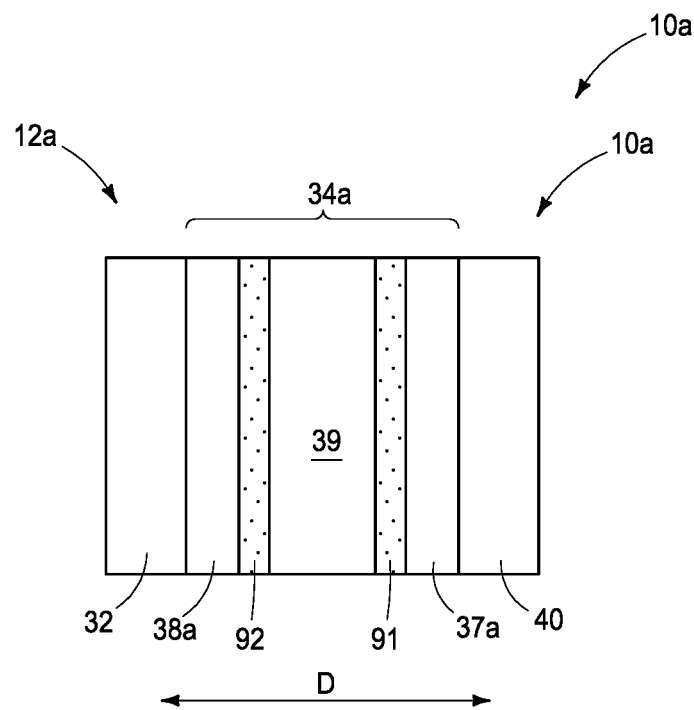
FIGS. 5 and 6 are diagrammatic cross-sectional views of a memory cell in accordance with embodiments of the invention.

An alternate example memory cell 30a of a construction 10a is described with references to FIG. 5. Like numerals from the above-described embodiments have been used where appropriate, with some construction differences being indicated with the suffix "a" or with different numerals.

Programmable material 34a within array 12a of construction 10a comprises a first region 37a comprising $SiN_x$ that is against, in one embodiment directly against, charge-passage material 40 and a second region 38a comprising $SiN_x$ that is against, in one embodiment directly against, charge-blocking material 32. Programmable material 34a comprises a third region 39 comprising $SiN_x$ that is between first region 37a and second region 38a. A first intervening region 91 is between and against, in one embodiment directly against, first region 37a and third region 39, with first intervening region 91 comprising $SiO_y$. Programmable material 34a comprises a second intervening region 92 that is between and against, in one embodiment directly against, second region 38a and third region 39.

In one embodiment, third region 39 is thicker than each of first and second regions 37a, 38a along direction D. In one embodiment, third region 39 is centered between first region 37a and second region 38a along direction D, and in one such embodiment third region 39 is thicker than each of first region 37a and second region 38a along direction D. By way of example only, a nominal thickness along direction D for programmable material 34a is 60 Angstroms, with example thicknesses for each of regions 37a and 38a being from 10 to 15 Angstroms and for third region 39 being from 20 to 30 Angstroms (along direction D). In one embodiment and as shown, there are three and only three of the $SiN_x$-comprising regions (e.g., 37a, 39, 38a) and two and only two of the $SiO_y$-comprising region (e.g., 91, 92).

An embodiment of the invention comprises an array (e.g., 12) of memory cells (e.g., 30). An embodiment of the invention comprises an array (e.g., 12) of elevationally-extending strings (e.g., 14) of memory cells (e.g., 30). In one embodiment, the array comprises NAND.

Figure 6:
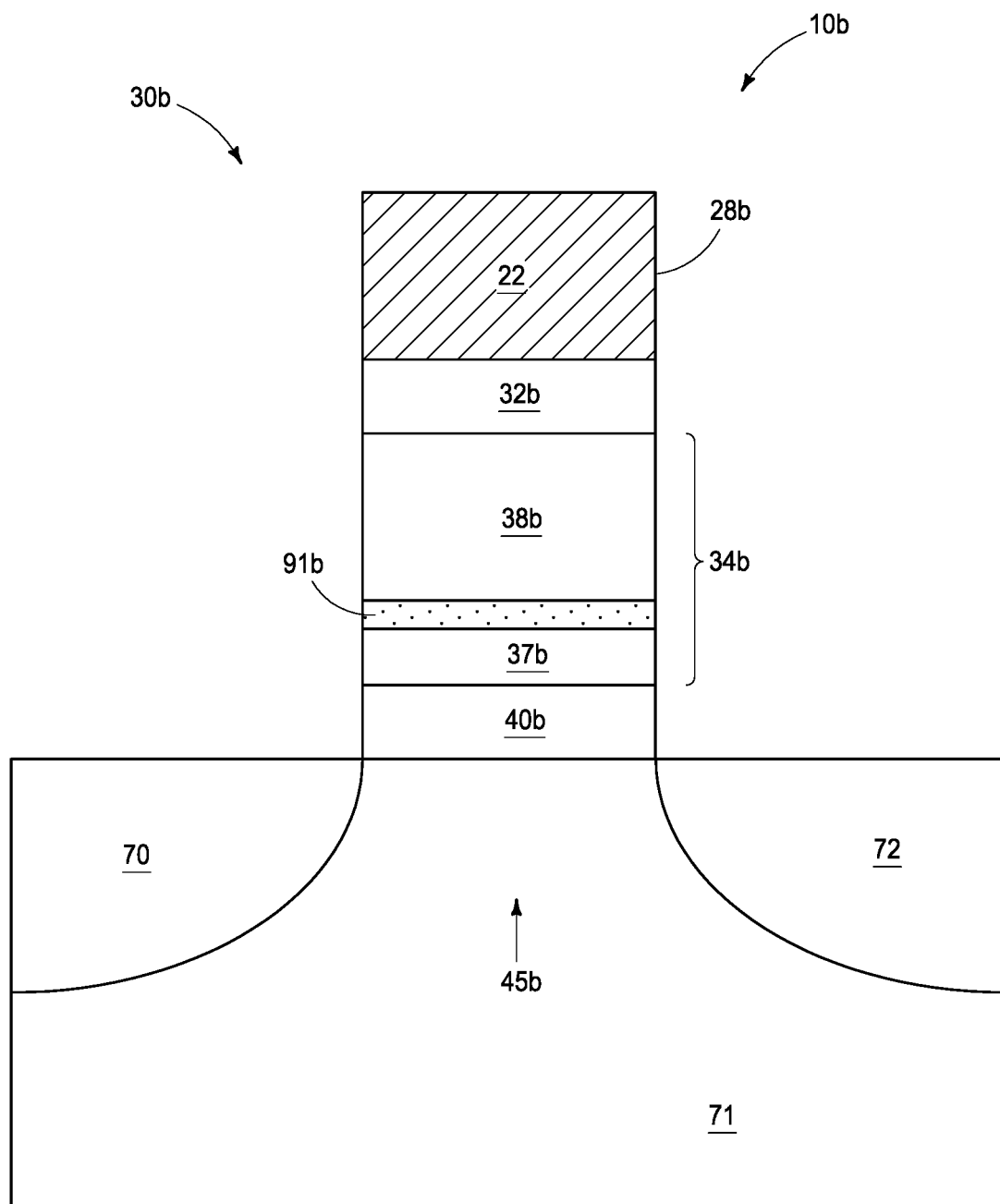

Memory cells 30, 30a are example elevationally-extending memory cells/transistors and which, in such embodiments, are shown to be vertical or within 100 of vertical. As an alternate example, a memory cell may be other than elevationally-extending, for example being a horizontal memory cell 30b of construction 10b as shown in FIG. 6. Like numerals from the above-described embodiments have been used where appropriate, with some construction differences being indicated with the suffix "b" or with different numerals. Memory cell 30b includes control gate 28b, charge-blocking region 32b, programmable material 34b, and insulative-charge passage material 40b. A pair of source/drain regions 70 and 72 are within a semiconductor base material 71. A channel region 45b is within semiconductor base material 71 and between source/drain regions 70 and 72, with channel region 45b being under charge-passage material 40b. Semiconductor base material 71 is shown as bulk material, although alternate constructions may be used (e.g., semiconductor-on-insulator). Programmable material 34b comprises at least two regions 37b, 38b comprising $SiN_x$ having a region 91b comprising $SiO_y$. Any other attribute(s) or aspect(s) as shown and/or described herein with respect to other embodiments may be used (e.g., more than two regions 37b, 38b and more than one intervening region 91b [not shown]).

In one embodiment, a memory cell (e.g., 12) comprises channel material (e.g., 48), charge-passage material (e.g., 40), programmable material (e.g., 34), charge-blocking material (e.g., 32), and a control gate (e.g., 28). The charge-blocking material is of different composition from those of the programmable material and the control gate (i.e., at least those parts closest thereto). The programmable material comprises:

a first region (e.g., 37) comprising $SiN_x$ that is directly against the charge-passage material, where "x" is 0.5 to 3.0;
a second region (e.g., 38) comprising $SiN_x$ that is directly against the charge-blocking material; and
an intervening region (e.g., 91) between and directly against the first and second regions, the intervening region comprising $SiO_y$, where "y" is 1.0 to 3.0.

In one embodiment, the second region is thicker than the first region along a shortest-straight-line direction from the charge-passage material to the charge-blocking material. Any other attribute(s) or aspect(s) as shown and/or described herein with respect to other embodiments may be used.

Embodiments of the invention encompass methods used in forming memory cells. Embodiments of the invention encompass memory cells independent of method of manufacture. Nevertheless, such memory cells may have any of the attributes as described herein in method embodiments. Likewise, the method embodiments may incorporate, form, and/or have any of the attributes described with respect to device embodiments.

In one embodiment, a method used in forming a memory cell (e.g., 12) comprises forming channel material (e.g., 48), forming charge-passage material (e.g., 40), forming programmable material (e.g., 34), forming a charge-blocking region (e.g., 31), and forming a control gate (e.g., 28). The programmable material is formed to comprise at least two regions (e.g., 37, 38) comprising $SiN_x$ having a region comprising $SiO_y$ therebetween (e.g., 91), where "x" is 0.5 to 3.0 and "y" is 1.0 to 3.0.

The forming of the programmable material comprises one of "a" and "b", where:
(a): forming the $SiN_x$; and
exposing the $SiN_x$ to oxygen-containing material to transform some of the $SiN_x$ to the $SiO_y$ that is directly against remaining of the $SiN_x$; and
(b): forming the $SiN_x$; and
depositing the $SiO_y$ against the $SiN_x$ by one of chemical vapor deposition, atomic layer deposition, or physical vapor deposition In one embodiment, the forming of the programmable material comprises the (a). In one embodiment, the forming of the programmable material comprises the (b), and in one such embodiment the deposited $SiO_y$ is directly against the $SiN_x$. Any other attribute(s) or aspect(s) as shown and/or described herein with respect to other embodiments may be used.

For the (b), any suitable methods of chemical vapor deposition, atomic layer deposition, or physical vapor deposition may be used that will deposit the $SiO_y$. Likewise, for the (a), any suitable oxygen-containing material may be used, and the exposing may include ion implantation and/or diffusion of oxygen or an oxygen-containing species. Further, and by way of examples only, example oxygen-containing materials that will transform the $SiN_x$ to the $SiO_y$ include $NH_4OH:H_2O_2:H_2O$ solution, $H_2SO_4:H_2O_2$ solution, $HCl:H_2O_2:H_2O$ solution, ozone-injected deionized $H_2O$, gases containing one or both of $O_2$ and $O_3$, in situ steam generation, etc.

Presence of the $SiO_y$ in or adjacent the $SiN_x$ may reduce thermionic emission of charge loss than would otherwise occur in the absence of the $SiO_y$.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 900 or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory cell comprises channel material, charge-passage material, programmable material, a charge-blocking region, and a control gate. The programmable material comprises at least two regions comprising $SiN_x$ having a region comprising $SiO_y$ therebetween, where "x" is 0.5 to 3.0 and "y" is 1.0 to 3.0.

In some embodiments, a memory cell comprises channel material, charge-passage material, programmable material, charge-blocking material, and a control gate. The charge-blocking material is of different composition from those of the programmable material and the control gate. The programmable material comprises a first region comprising $SiN_x$ that is directly against the charge-passage material, where "x" is 0.5 to 3.0. A second region comprises $SiN_x$ that is directly against the charge-blocking material. An intervening region is between and directly against the first and second regions. The intervening region comprises $SiO_y$, where "y" is 1.0 to 3.0.

In some embodiments, a memory cell comprises channel material, charge-passage material, programmable material, charge-blocking material, and a control gate. The charge-blocking material is of different composition from those of the programmable material and the control gate. The programmable material comprises a first region comprising $SiN_x$ that is directly against the charge-passage material, where "x" is 0.5 to 3.0. A second region comprises $SiN_x$ that is directly against the charge-blocking material. A third region comprises $SiN_x$ that is between the first and second regions. A first intervening region is between and directly against the first and third regions. The intervening region comprises $SiO_y$, where "y" is 1.0 to 3.0. A second intervening region is between and directly against the second and third regions, the second intervening region comprises $SiO_y$.

In some embodiments, a method used in forming a memory cell comprises forming channel material, forming charge-passage material, forming programmable material, forming a charge-blocking region, and forming a control gate. The programmable material is formed to comprise at least two regions comprising $SiN_x$ having a region comprising $SiO_y$ therebetween, where "x" is 0.5 to 3.0 and "y" is 1.0 to 3.0. The forming of the programmable material comprises one of "a" and "b", where (a): forming the $SiN_x$; and exposing the $SiN_x$ to oxygen-containing material to transform some of the $SiN_x$ to the $SiO_y$ that is directly against remaining of the $SiN_x$; and (b): forming the $SiN_x$; and depositing the $SiO_y$ against the $SiN_x$ by one of chemical vapor deposition, atomic layer deposition, or physical vapor deposition.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
   channel material;
   charge-passage material;
   programmable material;
   a charge-blocking region;
   a control gate; and
   the programmable material comprising at least two regions comprising $SiN_x$ having a region comprising $SiO_y$ therebetween, where "x" is 0.5 to 3.0 and "y" is 1.0 to 3.0.

2. The memory cell of claim 1 wherein "x" is 1.33.

3. The memory cell of claim 1 wherein "x" is not 1.33.

4. The memory cell of claim 3 wherein "x" is less than 1.33.

5. The memory cell of claim 3 wherein "x" is greater than 1.33.

6. The memory cell of claim 1 wherein "y" is 2.0.

7. The memory cell of claim 1 wherein "y" is not 2.0.

8. The memory cell of claim 7 wherein "y" is less than 2.0.

9. The memory cell of claim 7 wherein "y" is greater than 2.0.

10. The memory cell of claim 1 wherein "x" is 1.33 and "y" is 2.0.

11. The memory cell of claim 1 wherein "x" is not 1.33 and "y" is not 2.0.

12. The memory cell of claim 1 wherein the at least two $SiN_x$-comprising regions are at least 1.5 times as thick as the $SiO_y$-comprising region therebetween.

13. The memory cell of claim 12 wherein the at least two $SiN_x$-comprising regions are at least 2.0 times as thick as the $SiO_y$-comprising region therebetween.

14. The memory cell of claim 13 wherein the at least two $SiN_x$-comprising regions are at least 5.0 times as thick as the $SiO_y$-comprising region therebetween.

15. The memory cell of claim 14 wherein the at least two $SiN_x$-comprising regions are at least 10.0 times as thick as the $SiO_y$-comprising region therebetween.

16. The memory cell of claim 1 wherein the $SiN_x$ of the at least two $SiN_x$-comprising regions are of the same composition relative one another.

17. The memory cell of claim 1 wherein the $SiN_x$ of the at least two $SiN_x$-comprising regions are of different compositions relative one another.

18. The memory cell of claim 1 comprising two and only two of the $SiN_x$-comprising regions and one and only one of the $SiO_y$-comprising region.

19. The memory cell of claim 1 comprising three and only three of the $SiN_x$-comprising regions and two and only two of the $SiO_y$-comprising region.

20. The memory cell of claim 1 being vertical or within 10° of vertical.

21. The memory cell of claim 1 being horizontal or within 10° of horizontal.

22. An array of memory cells, the memory cells individually comprising the memory cell of claim 1.

23. An array of elevationally-extending strings of memory cells, the elevationally-extending strings of memory cells individually comprising the memory cell of claim 1.

24. The array of claim 23 comprising NAND.

25. A memory cell comprising:
channel material;
charge-passage material;
programmable material;
charge-blocking material;
a control gate;
the charge-blocking material being of different composition from those of the programmable material and the control gate; and
the programmable material comprising:
    a first region comprising $SiN_x$ that is directly against the charge-passage material, where "x" is 0.5 to 3.0;
    a second region comprising $SiN_x$ that is directly against the charge-blocking material; and
    an intervening region between and directly against the first and second regions, the intervening region comprising $SiO_y$, where "y" is 1.0 to 3.0.

26. The memory cell of claim 25 wherein the second region is thicker than the first region along a shortest-straight-line direction from the charge-passage material to the charge-blocking material.

27. A memory cell comprising:
channel material;
charge-passage material;
programmable material;
charge-blocking material;
a control gate;
the charge-blocking material being of different composition from those of the programmable material and the control gate; and
the programmable material comprising:
    a first region comprising $SiN_x$ that is directly against the charge-passage material, where "x" is 0.5 to 3.0;
    a second region comprising $SiN_x$ that is directly against the charge-blocking material;
    a third region comprising $SiN_x$ that is between the first and second regions;
    a first intervening region that is between and directly against the first and third regions, the intervening region comprising $SiO_y$, where "y" is 1.0 to 3.0; and
    a second intervening region that is between and directly against the second and third regions, the second intervening region comprising $SiO_y$.

28. The memory cell of claim 27 wherein the third region is thicker than each of the first and second regions along a shortest-straight-line direction from the charge-passage material to the charge-blocking material.

29. The memory cell of claim 27 wherein the third region is centered between the first and second regions along a shortest-straight-line direction from the charge-passage material to the charge-blocking material.

30. The memory cell of claim 29 wherein the third region is thicker than each of the first and second regions along the shortest-straight-line direction.

* * * * *